United States Patent
Farrell et al.

(10) Patent No.: US 8,427,380 B2
(45) Date of Patent: *Apr. 23, 2013

(54) DUAL FUNCTION COMPOSITE SYSTEM AND METHOD OF MAKING SAME

(75) Inventors: Brian Farrell, Quincy, MA (US); John J. Gannon, Jr., Sudbury, MA (US); Thomas G. Campbell, Concord, MA (US); Pat Anthony Coppola, Bedford, MA (US); Sean Gerald O'Reilly, Brighton, MA (US); Joseph F. Burke, Atkinson, NH (US)

(73) Assignee: Foster-Miller, Inc., Waltham, MA (US)

( * ) Notice: Subject to any disclaimer, the term of this patent is extended or adjusted under 35 U.S.C. 154(b) by 564 days.

This patent is subject to a terminal disclaimer.

(21) Appl. No.: 11/495,400

(22) Filed: Jul. 28, 2006

(65) Prior Publication Data
US 2007/0030205 A1 Feb. 8, 2007

Related U.S. Application Data

(60) Provisional application No. 60/704,089, filed on Jul. 29, 2005.

(51) Int. Cl.
*H01Q 1/28* (2006.01)
*H01Q 1/38* (2006.01)
*H01Q 1/00* (2006.01)

(52) U.S. Cl.
USPC .................. 343/705; 343/700 MS; 343/708; 343/905

(58) Field of Classification Search .................. 343/705, 343/708, 700 MS, 872, 873, 846, 905, 897, 343/850, 853; 29/846, 854, 825, 832, 600; 244/119, 297.1

See application file for complete search history.

(56) References Cited

U.S. PATENT DOCUMENTS

| | | | |
|---|---|---|---|
| 2,482,798 A * | 9/1949 | Rheinfrank, Jr. ........... 244/123.3 |
| 3,447,120 A * | 5/1969 | Rask Stanley et al. ....... 439/497 |
| 3,665,480 A | 5/1972 | Fassett | |
| 4,198,018 A * | 4/1980 | Brault ........................... 244/119 |
| 4,660,048 A | 4/1987 | Doyle | |
| 4,680,220 A | 7/1987 | Johnson | |
| 4,924,236 A * | 5/1990 | Schuss et al. .......... 343/700 MS |
| 5,160,936 A * | 11/1992 | Braun et al. .................. 343/725 |
| 5,184,141 A | 2/1993 | Connolly et al. | |

(Continued)

FOREIGN PATENT DOCUMENTS
DE 42 37 611 A1 5/1994

OTHER PUBLICATIONS

Garfield Library, University of Pennsylvania "This Weeks Citations Classic" Jul. 2, 1980; downloaded from the internet (http://www.garfield.library.upenn.edu/classics1980/A1980JS76800001.pdf) on Jun. 21, 2007 (one (1) page).
U.S. Appl. No. 11/495,789, filed Jul. 28, 2006, Farrell et al.

*Primary Examiner* — Hoang V Nguyen
(74) *Attorney, Agent, or Firm* — Iandiorio Teska & Coleman, LLP

(57) ABSTRACT

A dual function composite system includes a first electronic subsystem, a second electronic subsystem, and a composite member between the first and second electronic subsystems. The composite member includes plies of fabric, and resin impregnating the plies of fabric. At least one ply of the fabric includes signal transmission elements integrated therewith and interconnecting the first electronic subsystem with the second electronic subsystem.

75 Claims, 20 Drawing Sheets

U.S. PATENT DOCUMENTS

| | | | |
|---|---|---|---|
| 5,800,672 A | 9/1998 | Boyce et al. | |
| 5,851,645 A | 12/1998 | Glowasky et al. | |
| 6,013,588 A | 1/2000 | Ozaki | |
| 6,066,389 A | 5/2000 | Glowasky et al. | |
| 6,190,602 B1 | 2/2001 | Blaney et al. | |
| 6,198,445 B1 | 3/2001 | Alt et al. | |
| 6,291,049 B1 | 9/2001 | Kunkel et al. | |
| 6,324,053 B1 * | 11/2001 | Kamijo | 361/679.03 |
| 6,492,008 B1 | 12/2002 | Amagi et al. | |
| 6,727,197 B1 | 4/2004 | Wilson et al. | |
| 6,870,516 B2 | 3/2005 | Aisenbrey | |
| 7,023,390 B1 * | 4/2006 | Kim et al. | 343/705 |
| 7,109,943 B2 * | 9/2006 | McCarville et al. | 343/797 |
| 7,138,949 B1 | 11/2006 | Ryken et al. | |
| 7,253,777 B2 | 8/2007 | Blaschke et al. | |
| 7,273,576 B2 * | 9/2007 | White | 264/257 |
| 7,283,095 B2 | 10/2007 | Karanik et al. | |
| 7,352,284 B2 * | 4/2008 | Krill | 340/545.1 |
| 7,461,444 B2 * | 12/2008 | Deaett et al. | 29/600 |
| 7,740,932 B2 * | 6/2010 | Kismarton | 428/292.1 |
| 2003/0123693 A1 * | 7/2003 | Ohara | 381/409 |
| 2004/0196192 A1 | 10/2004 | Boyd et al. | |
| 2004/0217472 A1 | 11/2004 | Aisenbrey et al. | |
| 2005/0142694 A1 | 6/2005 | Choiu et al. | |
| 2006/0097947 A1 | 5/2006 | McCarville et al. | |

\* cited by examiner

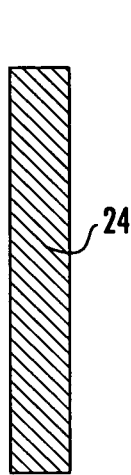
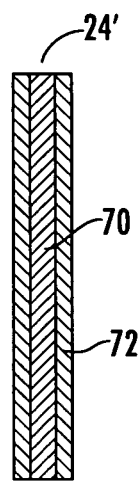
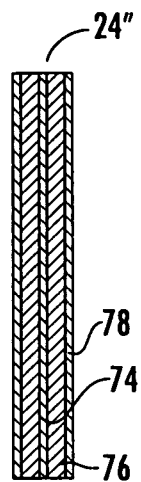
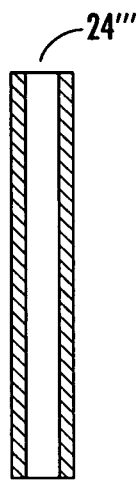
FIG. 9A  FIG. 10A  FIG. 11A  FIG. 12A
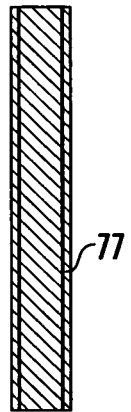
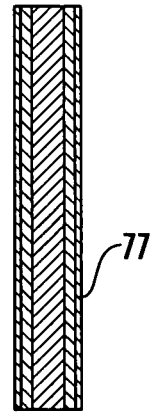
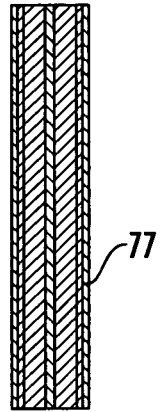
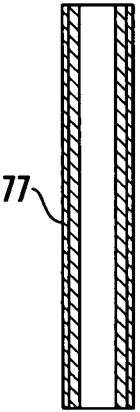
FIG. 9B  FIG. 10B  FIG. 11B  FIG. 12B

DUAL FUNCTION COMPOSITE SYSTEM AND METHOD OF MAKING SAME

RELATED APPLICATIONS

This application claims the benefit of and priority to U.S. Provisional Application No. 60/704,089, filed Jul. 29, 2005, which is hereby incorporated herein by reference.

FIELD OF THE INVENTION

This subject invention relates to a dual function composite system and electromechanical structures, and in one example, multilayer printed circuit boards which can replace conventional printed circuit boards.

BACKGROUND OF THE INVENTION

Composite technology offers a wide variety of advantages including a high strength to weight ratio. Thus, composite systems are now used in mobile platforms such as aircraft and spacecraft for a variety of structural components.

Those skilled in the art are also studying higher and more complex levels of system integration. In but one example, it would be useful to integrate antennas into composite aircraft wing panels or other aircraft structures such as a panel of a fuselage or a portion of a door, or to apply or attach antennas to an aircraft. Current design challenges include how to provide sufficient dielectric separation between the radiating antenna elements and the ground plane of the antenna. Plated through hole printed circuit board technology cannot be used in connection with such advanced systems due to the inability to form via structures in lightweight dielectric materials (e.g. open cell foams), and/or the inability to form very high aspect ratio vias in dielectric materials. Also, it would be desirable to integrate the electrical bus extending between the antenna and this electronic subsystem into the aircraft structure. Otherwise, the weight savings provided by composite technology will suffer and the cost of using composite technology will be prohibitive.

SUMMARY OF THE INVENTION

It is therefore an object of this invention to provide composite systems with integrated electrical subsystems.

It is a further object of this invention to provide, in one embodiment, a notional antenna fully integrated with a composite aircraft wing panel.

It is a further object of this invention to provide such an integrated notional antenna which also includes a bus integrated with composite aircraft structural members.

It is a further object of this invention to provide, in composite structures, signal transmission pathways through the thickness of the composite and running in the plane of the composite.

It is a further object of this invention to provide a functional replacement for a plated through hole in a printed circuit board when materials and/or geometries prevent a plated through hole from being formed.

The subject invention results from the realization that, given a three dimensional composite system, electrical pathways in one direction can be established by inserting conductive pins to extend through the composite panel and an electrical pathway in the direction of the plane of the panel can be affected by integrating conductors into a ply of a composite component. The invention results from the further realization that when plated through holes or vias in a printed circuit board are not possible, conductive pins may replace them as electrical pathways.

The subject invention, however, in other embodiments, need not achieve all these objectives and the claims hereof should not be limited to structures or methods capable of achieving these objectives.

This invention features a dual function composite system including a first electronic subsystem, a second electronic subsystem, and a composite member between the first and second electronic subsystems. The composite member includes plies of fabric and resin impregnating the plies of fabric. At least one ply of the fabric includes signal transmission elements integrated therewith and interconnecting the first electronic subsystem with the second electronic subsystem. In one embodiment, the first electronic subsystem is a notional antenna subsystem integrated with an aircraft panel, the second electronic subsystem including electronics for the notional antenna subsystem, and the composite member is a structural member supporting the aircraft panel. In one preferred configuration, the aircraft panel is a wing panel and the structural member is a wing spar. The notional antenna subsystem typically includes an array of radiating elements separated from a ground plane by a dielectric core, and a plurality of conductive pins extend through the core, each connected on one end to a radiating element. A printed circuit board is electrically connected to the other ends of the pins and electrically connected to the signal transmission elements in the wing spar. The dielectric core may be air, and in such a case the dielectric core will typically include a dielectric support mechanism for separating the radiating elements from the ground plane. The dielectric support mechanism may be, for example, a dielectric honeycomb structure, or a dielectric truss structure. In one configuration, the truss structure includes a network of dielectric pins forming the truss structure. The dielectric core also may be a low density material, preferably foam, or the dielectric core may be a polymer.

The system may further include a radome layer over the radiating elements, which may be made of astroquartz. The ground plane is typically a composite layer including plies of conductive fibers impregnated with a resin, and the fibers may be carbon fibers. A structural layer may be included between the ground plane and the printed circuit board, and the structural layer may include a foam sub-layer on a composite sub-layer. In one example, the composite sub-layer includes fibers impregnated with a resin, which may be carbon fibers. The ground plane typically includes holes therethrough for the conductive pins, the holes providing clearance between the conductive pins and the ground plane, and/or the conductive pins may be insulated.

The pins may be solid and made of a metal alloy which may include copper. In one variation, the pins include a composite core surrounded by metal coating. In another variation, the pins include a central conductor surrounded by dielectric material surrounded by a coaxial shield conductor. The pins may be tubular, and in one example some pins may be configured to provide sidewall metallization around a cavity of a radiating element. Radiating elements are printed on the dielectric core or the radiating elements may be printed on the dielectric core and the pins may be inserted through holes drilled in the dielectric core. Alternatively, the pins may first be inserted through the holes drilled in the dielectric core and the radiating elements are then printed over the pins. In one example, the signal transmission elements are wires woven into the at least one ply of the composite member, and the wires are insulated.

This invention also features a dual function composite system including first and second electronic subsystems. The first electronic subsystem is separated from a ground plane by a dielectric core and a plurality of conductive pins extend through the core, each connected on one end to the first electronic subsystem and on the other end to the second electronic subsystem. There is a composite member between the first and second electronic subsystems which includes plies of fabric and resin impregnating the plies of fabric. At least one ply of the fabric includes signal transmission elements integrated therewith and interconnecting the first electronic subsystem with the second electronic subsystem.

This invention further features a dual function composite system including a notional antenna subsystem integrated with an aircraft wing panel including an array of radiating elements separated from a ground plane by a dielectric core. A plurality of conductive pins extends through the core, each connected on one end to a radiating element. A printed circuit board is electrically connected to the other ends of the pins. This system also includes electronics for the notional antenna subsystem. A wing spar between the notional antenna subsystem and its electronics includes plies of fabric, with resin impregnating the plies of fabric. At least one ply of the fabric includes wires integrated therewith and interconnecting the printed circuit board with the electronics.

This invention also features a composite system including pins through a composite forming signal transmission pathways in a first direction, and at least one ply of the composite or another associated composite including signal transmission elements integrated therewith running in a second direction and connected to the signal transmission pathways formed by the pins. The composite typically includes a dielectric layer and radiating elements on one surface thereof, each on a pin. In one preferred embodiment, the dielectric layer is foam, although the dielectric layer may be air. In the latter case, the dielectric layer typically includes a dielectric support mechanism for providing structural support, which may be a honeycomb structure, or a dielectric truss structure including a network of dielectric pins. In one preferred example, the signal transmission elements are wires integrated with the fabric of the ply.

This invention further features a method of manufacturing a dual function composite system, the method including adding, in a composite member extending between first and second electronic subsystems, in at least one ply of the composite member, signal transmission elements integrated therewith to interconnect the first electronic subsystem with the second electronic subsystem. In one embodiment, the first electronic subsystem is a notional antenna subsystem integrated with an aircraft panel, the second electronic subsystem includes electronics for the notional antenna subsystem, and the composite member is a structural member supporting the aircraft panel. In one example, the aircraft panel is a wing panel and the structural member is a wing spar. The notional antenna subsystem typically will include an array of radiating elements separated from a ground plane by a dielectric core and a plurality of conductive pins extending through the core each connected on one end to a radiating element. The method may further include electronically connecting a printed circuit board to the other ends of the pins, and electrically connecting the printed circuit board to the signal transmission elements in the wing spar, the printed circuit board electrically connected to the signal transmission elements in the wing spar. The dielectric core may be air, and in such an example the dielectric core will typically include a dielectric support mechanism for separating the radiating elements from the ground plane. The dielectric support mechanism may be a dielectric honeycomb structure or a dielectric truss structure which may include a network of dielectric pins forming the truss structure. The dielectric core may be a low density material, preferably foam, or the dielectric core may be a polymer.

The method may further include adding a radome layer over the radiating elements, which may be made of astroquartz. The ground plane is typically a composite layer including plies of conductive fibers impregnated with a resin, which may be carbon fibers. There may be a structural layer between the ground plane and the printed circuit board, and the structural layer may include a foam sub-layer on a composite sub-layer. In one example, the composite sub-layer includes fibers impregnated with a resin, which may be carbon fibers. The ground plane typically includes holes therethrough for the conductive pins, and/or the conductive pins may be insulated. There may be holes providing clearance between the conductive pins and the ground plane.

In one example, the pins are solid and made of a metal alloy which may include copper. In one variation, the pins include a composite core surrounded by metal coating. In another variation, the pins include a central conductor surrounded by dielectric material surrounded by a coaxial shield conductor. In another variation, the pins are tubular, and in one configuration some pins may be configured to provide side wall metallization around a cavity of a radiating element. The radiating elements may be printed on the dielectric core and the pins may be inserted through holes drilled in the dielectric core. Alternatively, the pins may first be inserted through the holes drilled in the dielectric core and the radiating elements are then printed over the pins. In one example, the signal transmission elements are wires woven into the at least one ply of the composite member, and the wires are insulated.

This invention also features a method of manufacturing a dual function composite system, the method including adding, in a composite member extending between a notional antenna subsystem and electronics for the notional antenna subsystem, in at least one ply of the composite member, wires integrated therewith to interconnect the notional antenna subsystem with the electronics.

This invention further features a method of manufacturing a dual function composite system, the method including adding, in a composite member extending between first and second electronic subsystems, in at least one ply of the composite member, fabric signal transmission elements integrated therewith to interconnect the first electronic subsystem with the second electronic subsystem. The method further includes separating the first electronics subsystem from a ground plane by a dielectric core, disposing a plurality of conductive pins to extend through the core, and connecting one end of the pins to the first electronics subsystem and the other end of the pins to the second electronics subsystem.

This invention also features a method of fabricating a composite system, the method including driving pins through a composite to form signal transmission pathways in a first direction, and including in at least one ply of the composite or another associated composite member, signal transmission elements integrated therewith and running in a second direction. The method further includes connecting the signal transmission elements to the signal transmission pathways formed by the pins.

BRIEF DESCRIPTION OF THE DRAWINGS

Other objects, features and advantages will occur to those skilled in the art from the following description of a preferred embodiment and the accompanying drawings, in which:

FIG. 9A is a schematic cross-sectional view of an example of one type of pin useful as a transmission element in accordance with the subject invention;

FIG. 10A is a schematic cross-sectional view showing another example of a transmission pin in accordance with the subject invention;

FIG. 11A is a schematic cross-sectional view of still another embodiment of a transmission pin in accordance with the subject invention;

FIG. 12A is a schematic cross-sectional view of yet another embodiment of a transmission pin in accordance with the subject invention;

FIGS. 9B-12B are schematic views showing the pin examples of FIGS. 9-12 insulated;

DISCLOSURE OF THE PREFERRED EMBODIMENT

Figure 1:
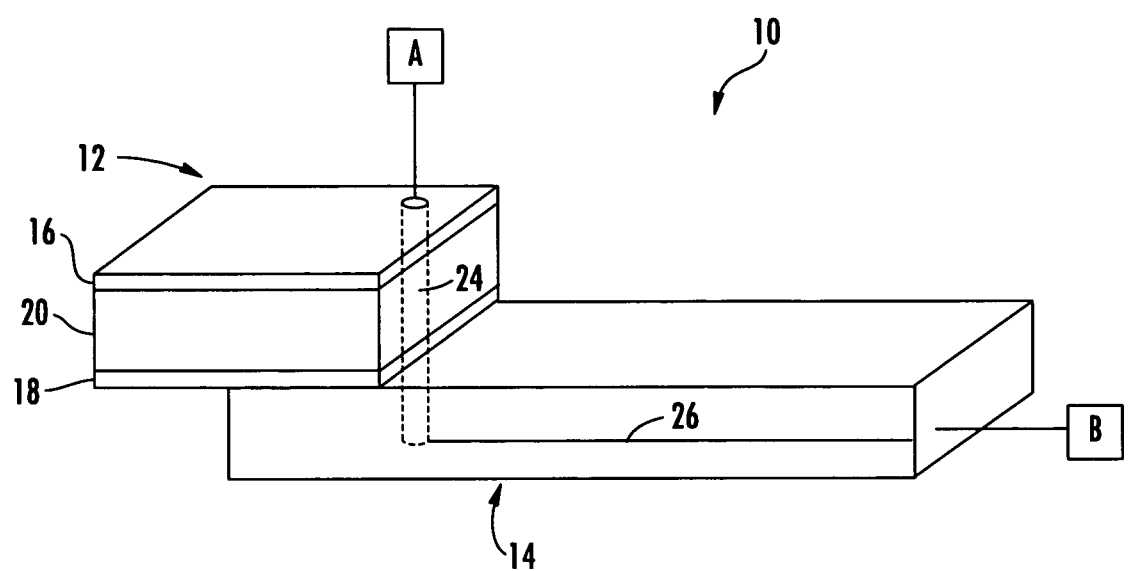
FIG. 1 is highly schematic three-dimensional view showing an example of a composite system with an integrated electrical subsystem in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

FIG. 1 illustrates a simplified view of a three-dimensional composite system 10 including composite members 12 and 14. Composite member 12 typically includes face sheets 16 and 18 separated by core 20. Face sheets 16 and 18 may be fabricated from plies of fabric impregnated with resin. Core 20 may be a lightweight cellular material, e.g. foam, or air. Composite member 14 includes numerous plies of fabric impregnated with resin.

One goal of the subject invention is to route signals from electronic subsystem A through composite system 10 to electronic subsystem B. Conductive pin 24 is shown extending through the thickness of composite member 12 to provide signal routing in one direction through the thickness of the composite member and wire 26 is shown integrated with the fabric of one ply of composite member 14 to provide signal routing in another direction mainly in the plane of composite member 14. By using multiple pins in composite member 12 and multiple wires integrated with one or more plies of the composite member 14, multiple electrical pathways and/or a bus can be established between subsystems A and B.

Figure 2:
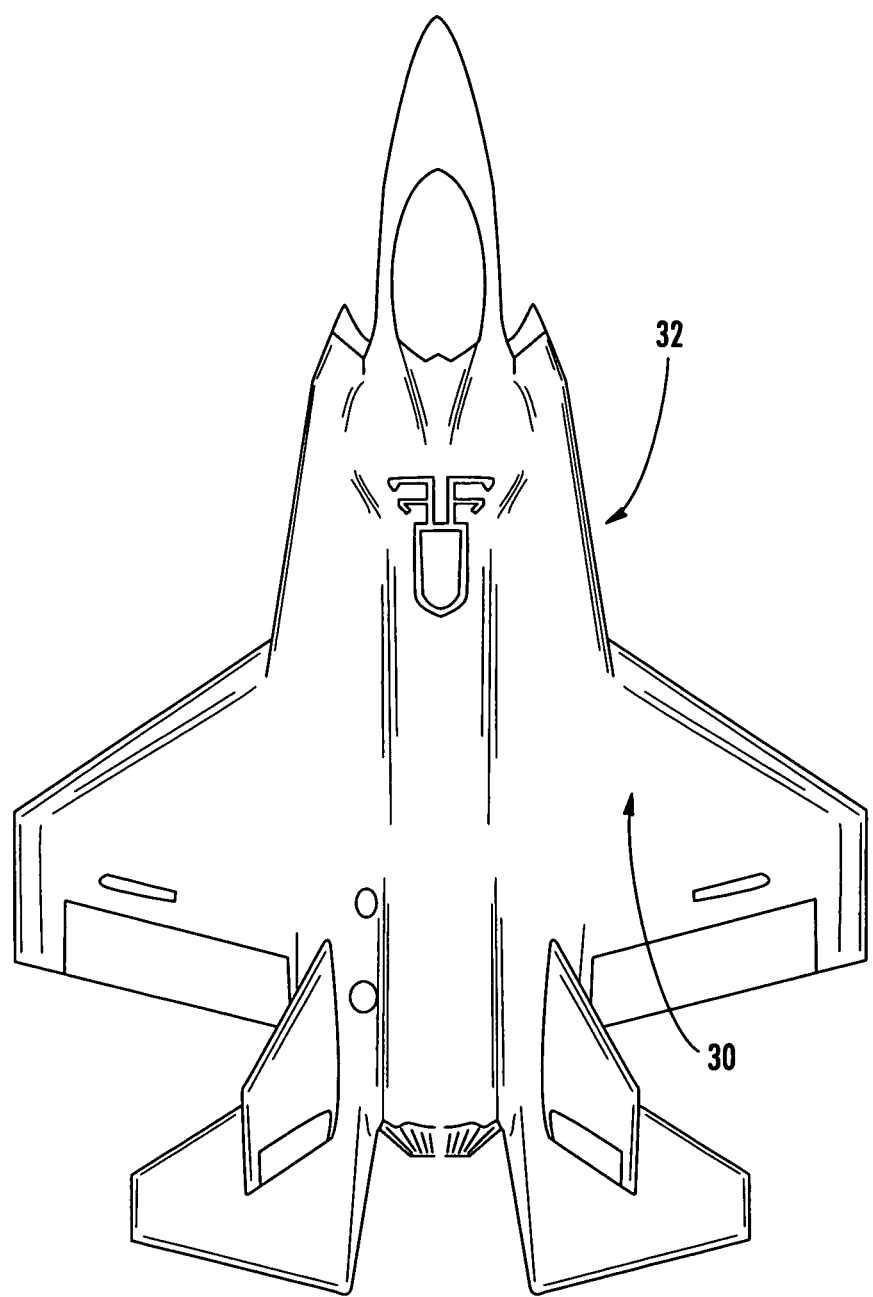
FIG. 2 is a schematic three-dimensional top view of a fighter aircraft including a wing section with an integrated antenna array in accordance with the subject invention.

In accordance with the present invention, aircraft 32, FIG. 2 includes an integrated notional antenna electrically interconnected with an electronic subsystem within aircraft 32. The integrated notional antenna can be located on any portion of a mobile platform such as an aircraft, for example, on the panel of an airplane fuselage or portion of a door. As shown, the integrated notional antenna is included in wing portion or panel 30 of aircraft 32.

Figure 3:
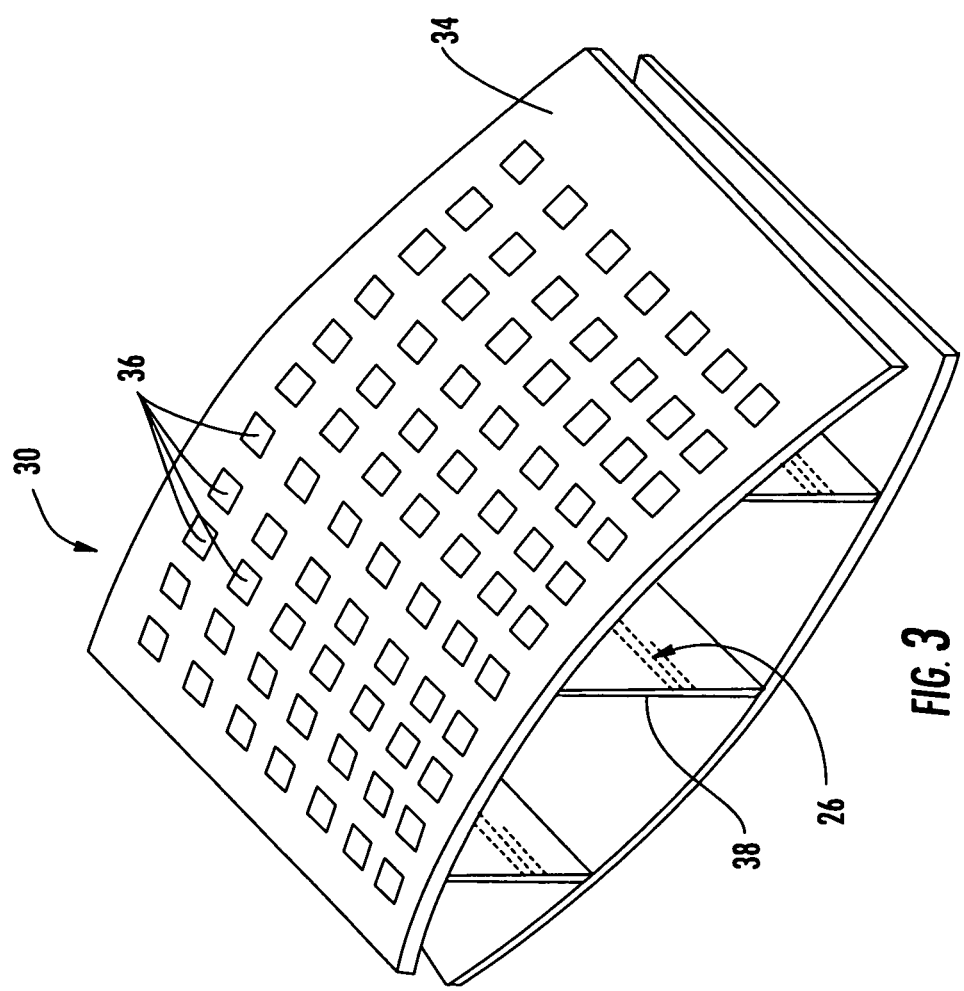
FIG. 3 is a schematic three-dimensional cutaway side view showing a portion of the wing of FIG. 2.
Figure 4:
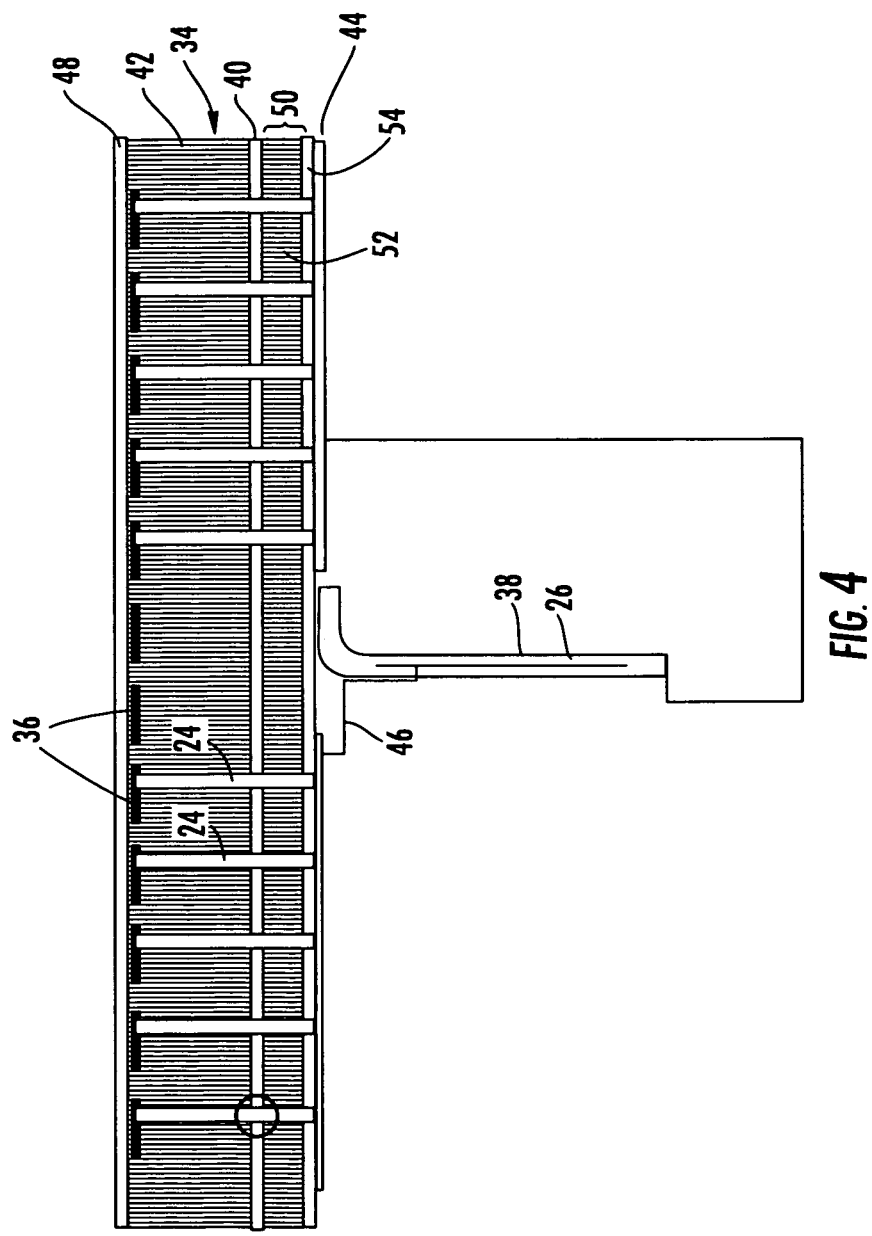
FIG. 4 is a schematic side cross-sectional view of the wing structure shown in FIG. 3.

Wing portion 30 is shown in more detail in FIGS. 3-4. Composite lower wing surface 34 includes an integrated array of radiating elements 36. Elements 36 may be rectangular, circular or elliptical with dimensions on the order of 0.1 inches by 0.1 inches up to several inches by several inches depending on the radar operating frequency. The separation between the centers of elements 36 can be or the order of 0.25 inches to several feet.

Figure 5:
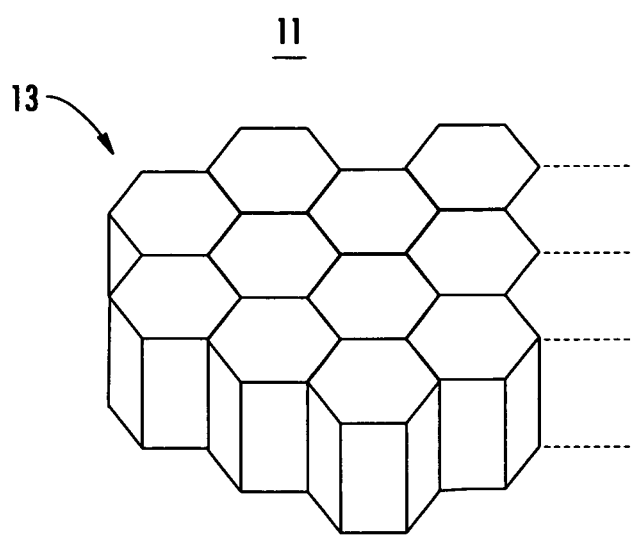
FIG. 5 is a highly schematic three-dimensional view of one embodiment of a dielectric support mechanism for use with the subject invention.
Figure 6A:
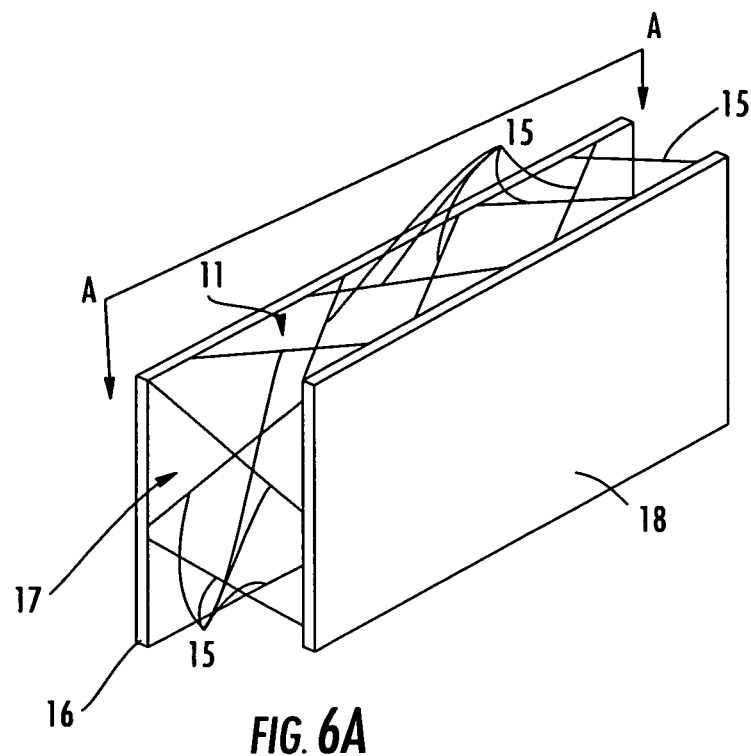
FIG. 6A-6B are highly schematic views of another embodiment of a dielectric support mechanism for use with the subject invention.
Figure 6B:
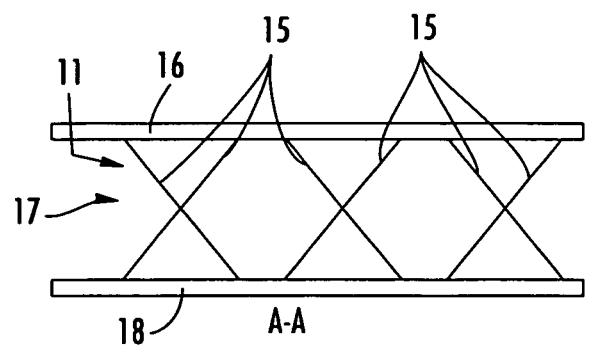

Integrated wires 26 may be included in any suitable structural member such as an aircraft fuselage, door, or portion of a wing. In one preferred configuration, composite spar 38 includes integrated wires 26 for connecting the antenna subsystem to its associated electronics package and for providing support for the aircraft wing panel. As shown more clearly in FIG. 4, the notional antenna subsystem includes an array of radiating elements 36 separated from ground plane 40 by core 42 of low density or lightweight cellular material, or air, serving as a standoff dielectric. The dielectric may be any polymer, foam (open cell or closed cell), or in the case where core 42 is air, structural integrity is maintained by a dielectric support mechanism 11, FIGS. 5 and 6A-6B. One embodiment of such a dielectric support mechanism 11 is honeycomb structure 13, FIG. 5, which may be made up of plastic, thermoplastic polymer, e.g., liquid crystal polymer or LCP, Kevlar, aramid, or other known materials. In another example, structural support can be provided by a dielectric support mechanism 11 including a network of dielectric pins 15 configured as truss structure 17, FIGS. 6A-6B. One example of such a structure is discussed in U.S. Pat. No. 6,291,049 which is incorporated herein by reference. Dielectric pins 15 are typically non-conductive material such as ceramic, glass, polymer or other known material. The size, number, and angles of dielectric pins 15 may be varied depending on a particular desired application.

In one preferred embodiment, the radiating elements 36, FIG. 4 are separated from ground plane 40 by dielectric open cell foam core 42 made of polyetherimide or polymethacrylimide with a thickness in the range between approximately several thousandths of an inch to several inches depending a particular application or design operating frequency. Conductive pins 24 extend through the core and each one is connected on one end to a radiating element 36. The other ends of the pins are electrically connected to printed circuit board 44 which is connected as shown at 46 to wires 26 integrated (e.g., woven, knitted or braided) with the fabric of one ply of composite spar 38. Cover or radome layer 48 is shown over radiating elements 36, typically to decrease aerodynamic drawbacks and to protect radiating elements 36. Layer 48 is preferably made of astroquartz or glass, but may be made of any material which is effectively transparent at appropriate frequencies of radar operations. In the case of placement on an airplane wing, such material will typically possess load-bearing characteristics to withstand environmental stresses encountered along the wing of an aircraft. Typically, ground plane 40 is a composite structure including plies of conductive (e.g., carbon) fiber impregnated with a resin such as Cytec 977-3 or Hexel M73. Optional structural layer 50 includes structural foam sub-layer 52 and composite sub-layer 54.

Figure 7:
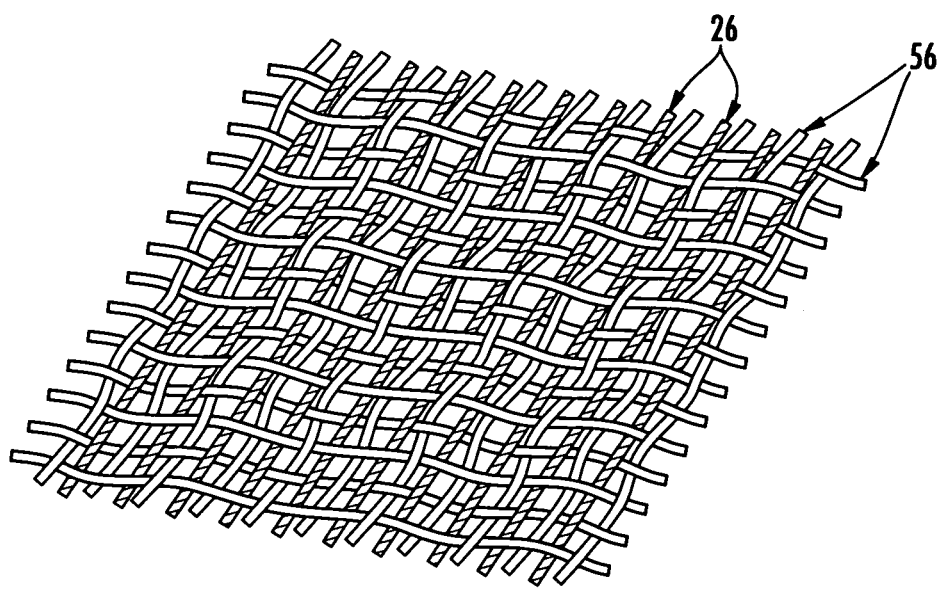
FIG. 7 is a highly schematic representation showing how individual insulated wires can be woven with the fabric of a ply of a composite structure in accordance with the subject invention.

FIG. 7 shows one internal ply of composite spar 38, FIG. 4 where insulated wires or cables 26 are interwoven, with fabric threads 56. In one example, spar 38 includes a textile impregnated with a resin. See also U.S. Pat. No. 6,727,197 incorporated herein by this reference. Alternatively, wires 26 may be woven or knitted with fabric threads 56.

Figure 8:
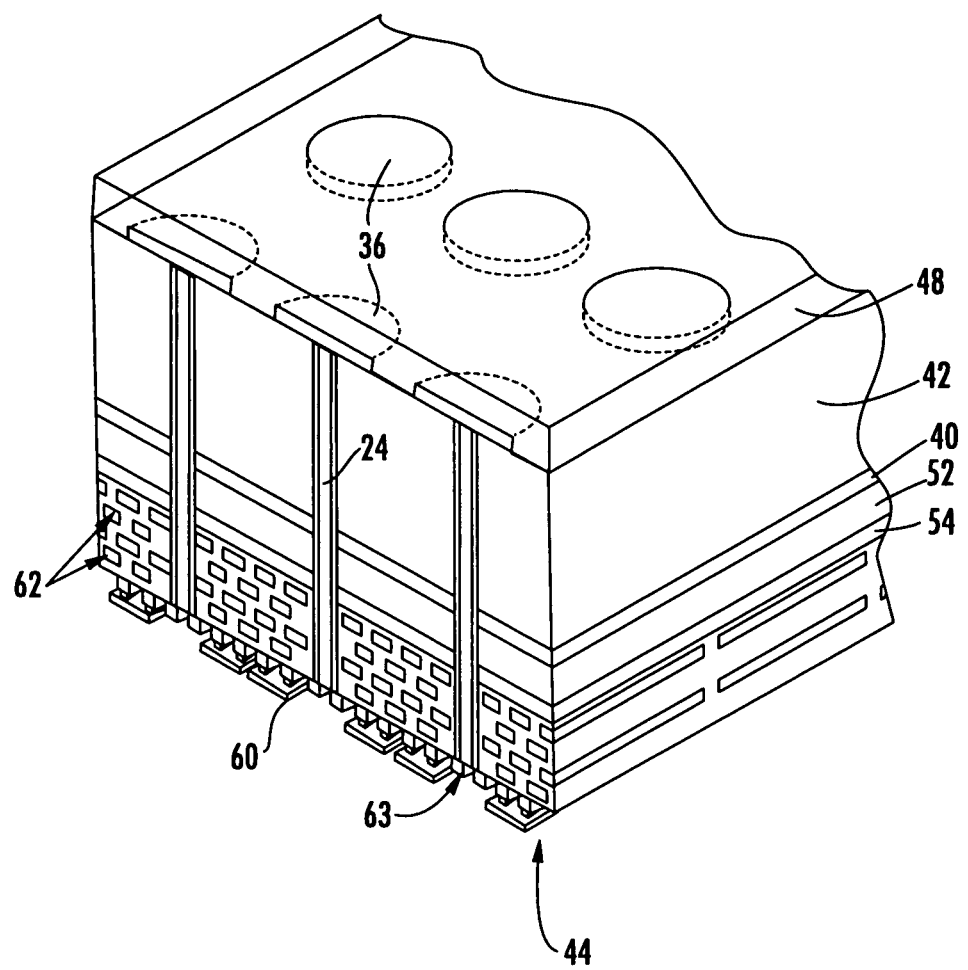
FIG. 8 is a schematic three-dimensional cut-away view showing one embodiment of a radar tile assembly for a notional antenna integrated as part of a panel of the wing structure of FIG. 3.

FIG. 8 shows in more detail multilayer printed circuit board 44 with back side transmit and receive components 60 and back side redistribution layers 62. Foam layer 42 forms a dielectric standoff. Sub-layer 52 in combination with ground plane 40, itself typically including carbon fibers, and carbon fiber composite sub-layer 54, provide mechanical strength and stiffness and provide a suitable load-bearing structure where lightweight, high structural strength and rigidity are important considerations. Similarly to core 42, sub-layer 52 may include a honeycomb structure, truss structure, or low density material, and like core 42, is preferably foam in one embodiment. Sub-layer 52 may have a thickness in the range of between approximately 0.25 inches and 2 inches, and sub-layer 54 together with ground plane 40 may have a thickness in the range of between approximately 0.06 inches and 0.10 inches. In one preferred embodiment, foam layer 42 is approximately 0.10 inches thick, sub-layer 52 is approximately 0.25 inches thick, and sub-layer 54 together with ground plane 40 is approximately 0.10 inches thick. Pins 24 provide feeds to radiating elements 36 from a metallurgical connection with a backside pad as shown at 63. Such a high aspect ratio hybrid structure is not generally achievable with conventional printed circuit board manufacturing techniques.

In one example, pin 24, FIG. 9A may be solid metal alloy made of copper and beryllium and be between approximately 0.005 inches and 0.062 inches in diameter. There are typically 1-2 pins per radiating element.

In another embodiment, pin 24', FIG. 10A includes composite core 70 surrounded by metal coating 72 such as nickel/gold. In still another embodiment, coaxial pin 24", FIG. 11A includes central conductor 74 surrounded by dielectric 76 itself surrounded by a coaxial shield 78 made of conductive material to isolate central conductor 74 from any external electrical radiation. Alternatively, pin 24''', FIG. 12A is tubular and made of metal alloy such as copper and beryllium. In any configuration, pins 24-24''' may be insulated. Pilot holes drilled in circuit board 44, FIG. 8 enable small diameter pins to be inserted to minimize use of circuit board area for pin interconnects. The pilot holes can be undersized for a slight press fit with the individual pins. Although pins 24 are shown herein as extending vertically, this is not a necessary limitation of the invention, and pins 24 may be oriented at an angle as desired for a particular application. Also, although pins 24 are preferably electrical conductors, this is not a limitation of the invention. In one configuration, the pins may be optical fibers for connecting the systems.

In the embodiment of FIG. 8, ground plane 40 abuts pins 24, and therefore pins 24 in multilayer printed circuit board 44 are preferably insulated to prevent electrical contact with ground plane 40. In one example, pins 24 are isolated from the ground plane by non-conductive insulating material 77. Insulation 77 may surround pin types 24, 24', 24", and 24''' as desired for a particular application as shown in FIGS. 9B-12B. Insulation 77 may be polymer, glass, ceramic, Kevlar, fiberglass, or any other non-conductive material.

Figure 13:
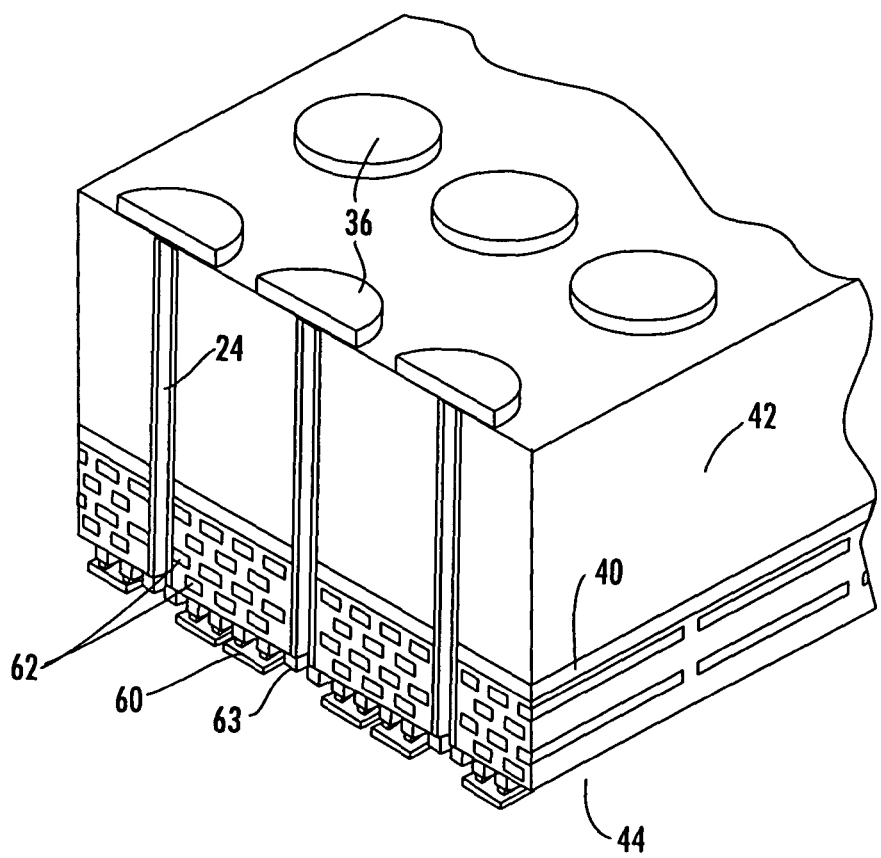
FIG. 13 is a schematic three-dimensional cut-away view showing another embodiment of a radar tile assembly for a notional antenna integrated as part of the top panel of the wing structure shown in FIG. 3.

In another embodiment, multilayer printed circuit board 44, FIG. 13 does not include structural layer 50, FIG. 4, however, ground plane 40 including plies of carbon fiber impregnated with resin provides structural support. Since ground plane 40 abuts pins 24, insulated pins 24 are preferred.

Figure 14:
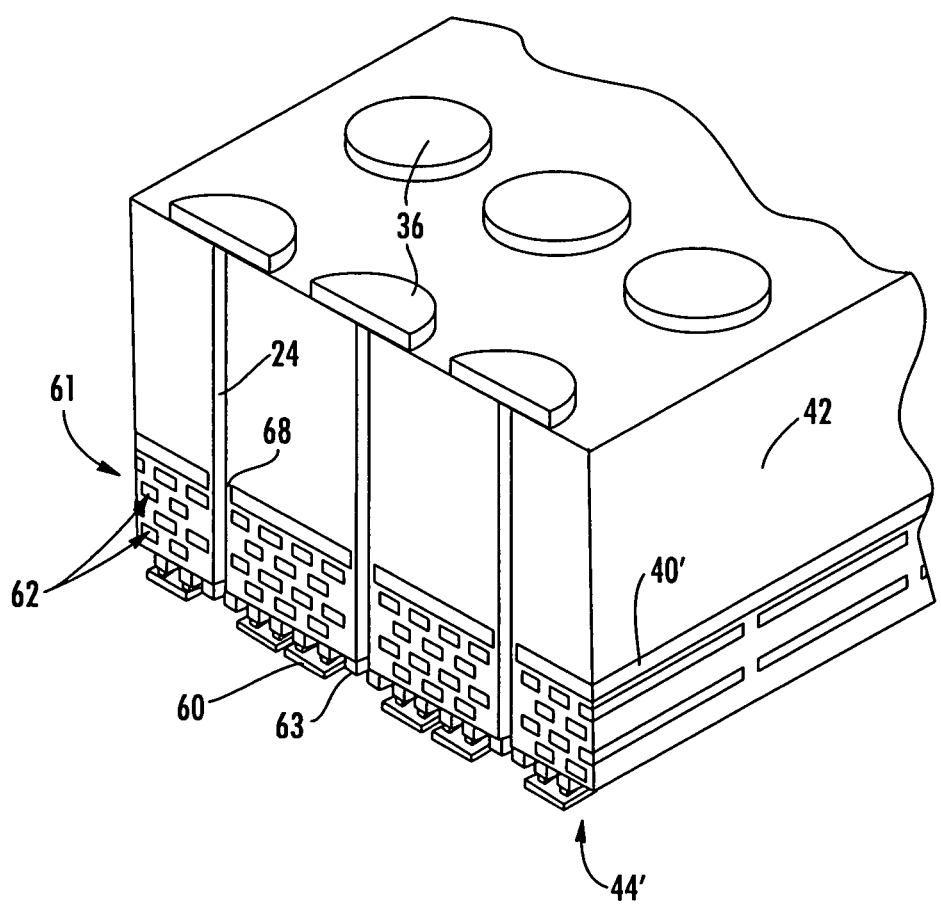
FIG. 14 is a three-dimensional cut-away view of a multi-layer printed circuit board without plated through holes shown as part of another form of a notional antenna in accordance with the present invention.

In a further embodiment, ground plane 40', FIG. 14 of multilayer printed circuit board 44' forms a thin top layer over the printed circuit board 61 including backside redistribution layers 62. In one example, ground plane 40' is a copper metal layer typically between 0.0003 inches and 0.003 inches thick. Although minimal to no structural support is provided, due to its light and flexible nature, in one example multilayer printed circuit board 44' may serve as another type of notional antenna which can be affixed to an aircraft by attaching or hanging it rather than forming an integral portion of the aircraft structure. In a preferred configuration, ground plane 40' includes clearance holes 68 therethrough for conductive pins 24 so the pins do not contact the ground plane. In this case, pins 24 may be insulated or non-insulated as desired.

Accordingly, the subject invention provides composite systems with integrated electrical subsystems, in one example notional antennas, and in various embodiments, further provides an improved alternative to plated through holes where material types or other parameters such as high aspect ratio prohibit the use of conventional boards.

Figure 15:
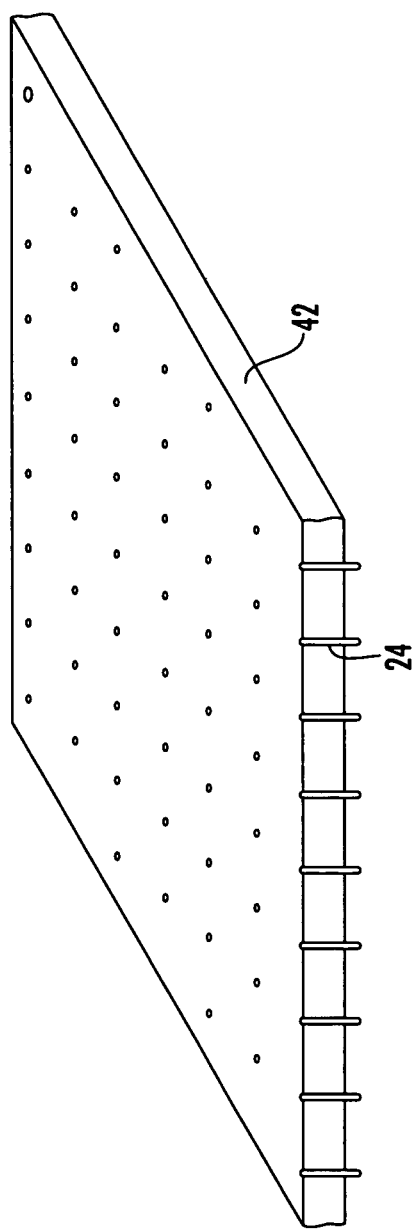
FIG. 15 is a schematic three-dimensional front view showing one example how transmission or feed pins are inserted into a foam body in accordance with the subject invention.
Figure 16:
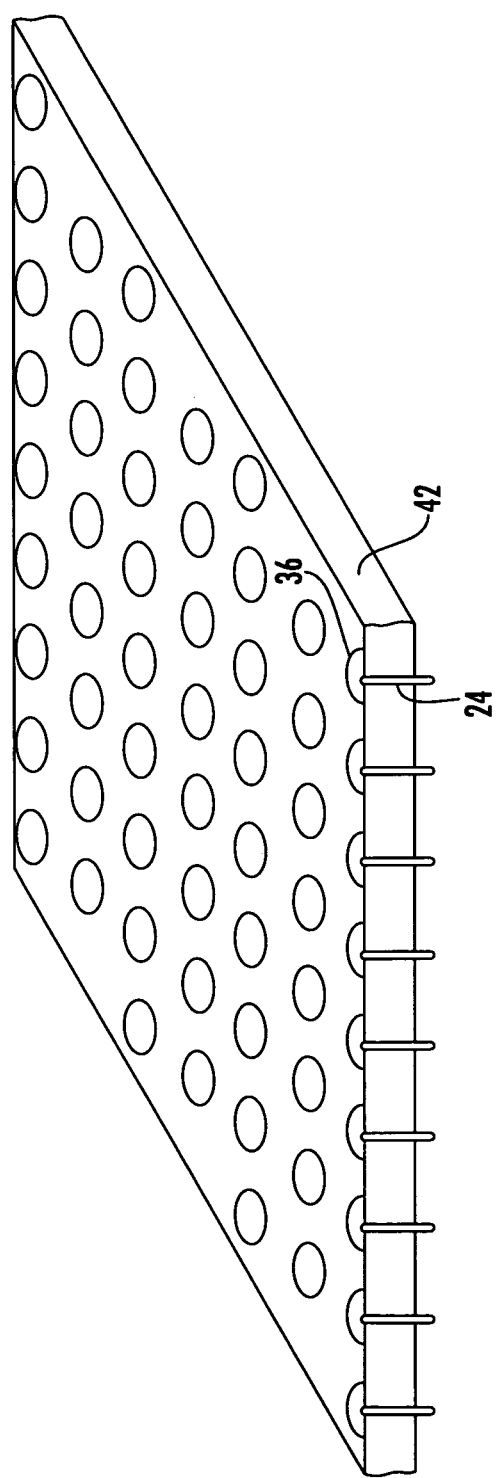
FIG. 16 is a schematic three-dimensional front view showing one example how radiator patches are deposited on the foam body of FIG. 15 over the pins.

In one embodiment, fabrication begins by inserting feed pins 24 in foam panel 42, FIG. 15. The pins can be inserted manually with or without pilot holes drilled in foam panel 42, inserted using an ultrasonic horn, and/or inserted using numerical control processes. Next, radiator elements 36 are direct metal deposited on foam panel 42, FIG. 16. A protective layer (not shown) such as LCP, epoxy glass, or the like or a bonding film or layer or metamaterials may be used to bond the elements 36 to panel 42. The radiator elements make metallurgical contact with the pins 24 previously inserted in foam panel 42. Alternatively, a direct printing technique can be used to create a radiator element pattern, or patched radiator elements could be formed on a flex circuit film bonded to foam panel 42.

Figure 17:
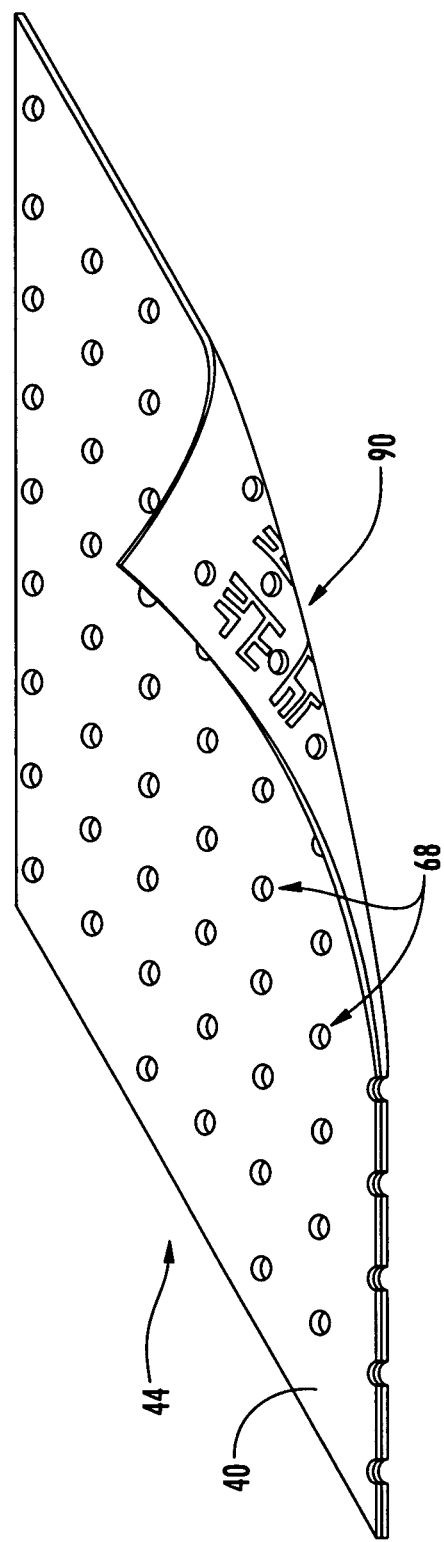
FIG. 17 is a schematic three-dimensional front view showing one example of fabrication of a multi-layer printed circuit board for power and signal re-distribution for the panel of the aircraft wing structure shown in FIG. 3.

Next, the multilayer printed circuit board is fabricated as shown in FIG. 17 to include copper ground plane 40, clearance holes 68, power and distribution circuitry as shown at 90 all on a multilayer flex circuit board. The multilayer flex circuit board may include a flexible substrate such as polyimide, LCP, or foam. This multilayer printed circuit board provides power and signal redistribution and backside component attachment for MMICs and the like, and one example of the resultant multi-layer printed circuit board is board 44', FIG. 14, where pins 24 are uninsulated.

Figure 18:
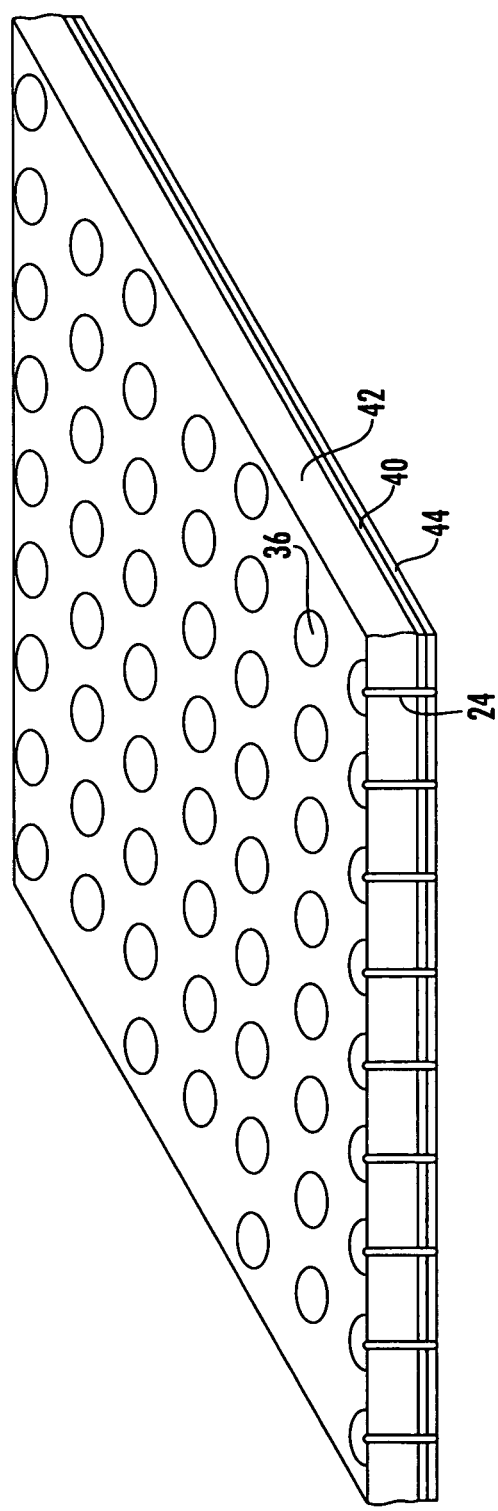
FIG. 18 is a schematic three-dimensional front view showing one example how the flex circuit of FIG. 17 is bonded to the foam panel of FIG. 16 in accordance with the subject invention.

Thus, this flex circuit is bonded to the foam panel as shown in FIG. 18. Solder reflow techniques are used to electrically interconnect the radiator feeds provided by pins 24 to the flex circuit. The solder is reflowed to complete the metallurgical connection of the pad to pin on the back side. In one variation, a conductive polymer such as conductive epoxy could be used in place of solder.

Figure 19:
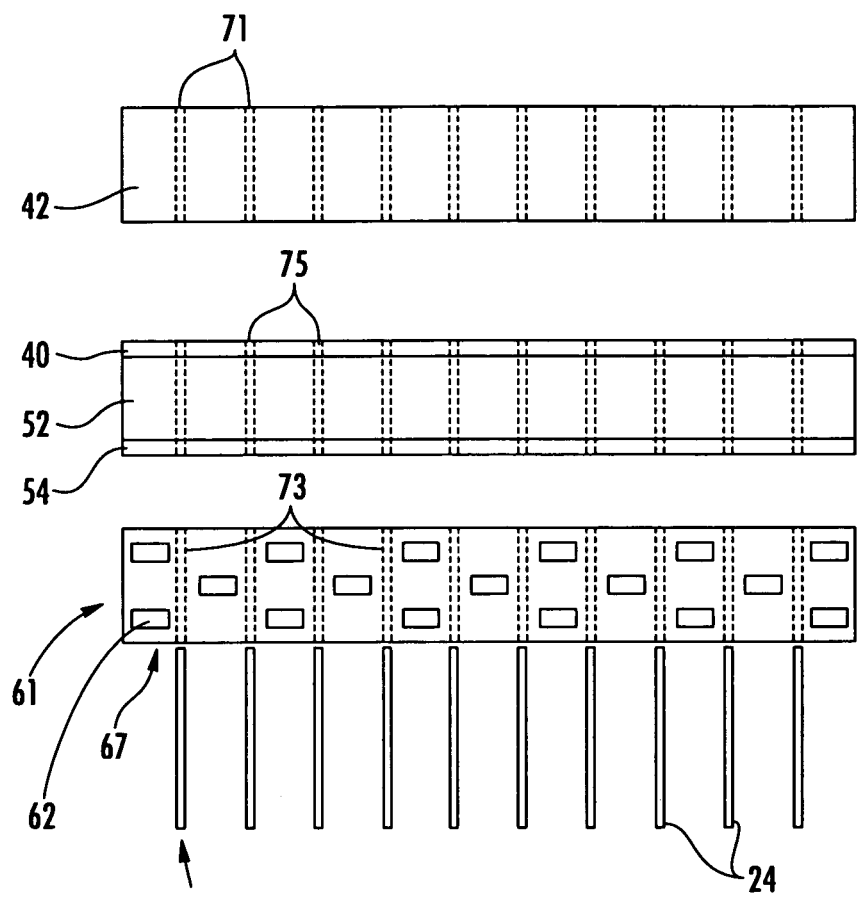
FIG. 19 is a schematic view of one example of a fabrication process in accordance with the present invention.
Figure 20:
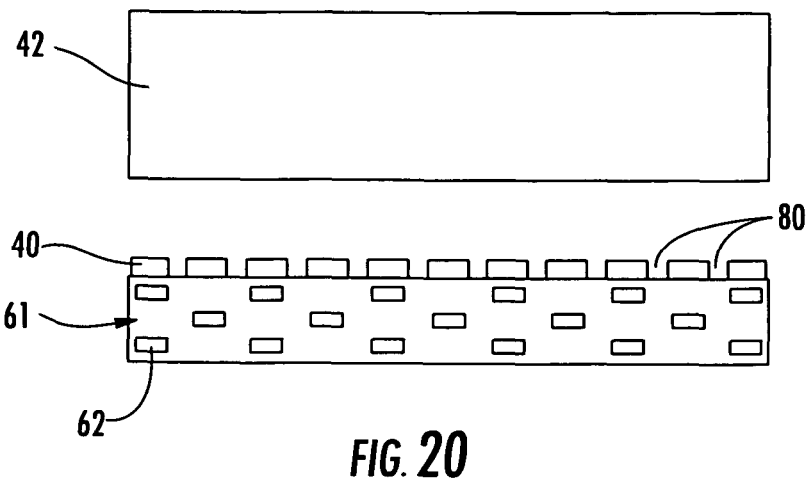
FIGS. 20-23 are schematic views of another example of a fabrication process in accordance with the present invention.

In another embodiment, fabrication begins by pre-drilling pilot holes 71, FIG. 19 in foam core 42 and pre-drilling pilot holes 73 in printed circuit board 61 which typically includes redistribution portion 62. Pilot holes 75 are formed in ground plane 40 and sub-layers 52 and 54 typically by using an ultrasonic horn using known ultrasonic techniques. Next, feed pins 24 are inserted through printed circuit board 61, sub-layers 52 and 54, ground plane 40, and core 42 from backside 67, thus bonding the various layers together and forming an electromechanical structure, i.e. a multi-layer printed circuit board, and in one example, the resultant multi-layer circuit board may be board 44, FIG. 8, after inclusion of metallurgical elements, antenna elements, and the like as desired for a particular application.

Figure 21:
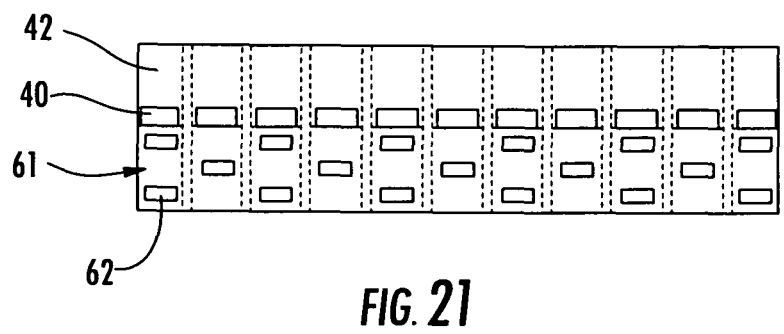
Figure 22:
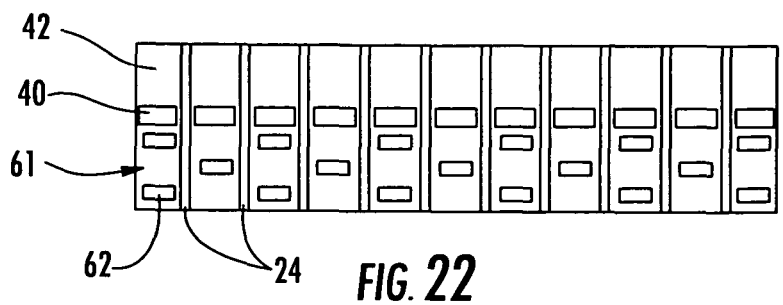
Figure 23:
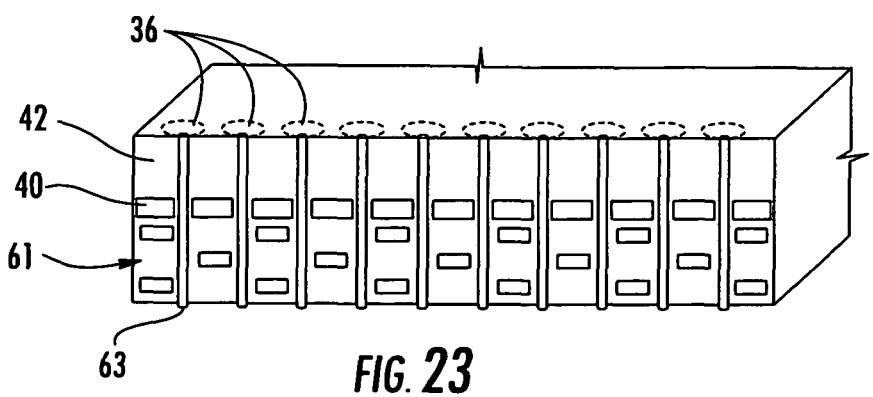

A further embodiment is shown in FIGS. 21-23, where fabrication begins by pre-drilling pilot holes 80, FIG. 21 in ground plane 40 which is a thin top layer over printed circuit board 61 including redistribution portion 62. Next, foam core 42 is attached to ground plane 40 and printed circuit board 61 and ground plane 40 are drilled, FIG. 22, and pins 24 are then inserted through each of the printed circuit board 61, the ground plane 40, and the foam core 42, FIG. 23. Next, metallurgical connections 63, FIG. 23 can be formed as shown, and antenna elements 36 may be direct deposited or printed on core 42 as discussed above. In each variation, the resulting electromechanical structure is capable of being used in place of printed circuit boards with plated through holes for particular desired applications as discussed above.

Figure 24:
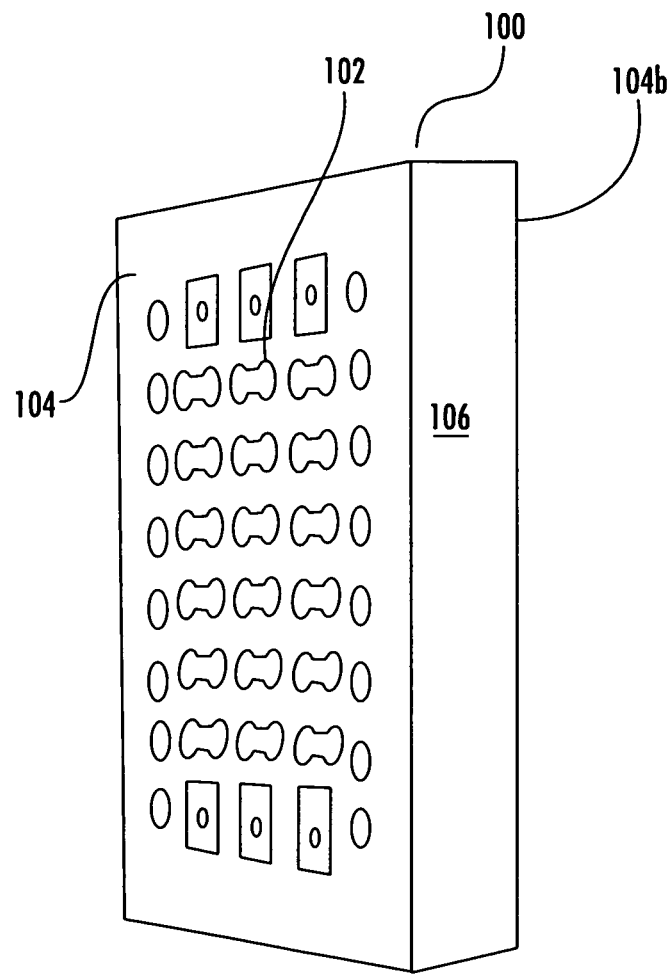
FIG. 24 is a schematic three-dimensional side view of an electro-mechanical tile test structure in accordance with the subject invention.
Figure 25:
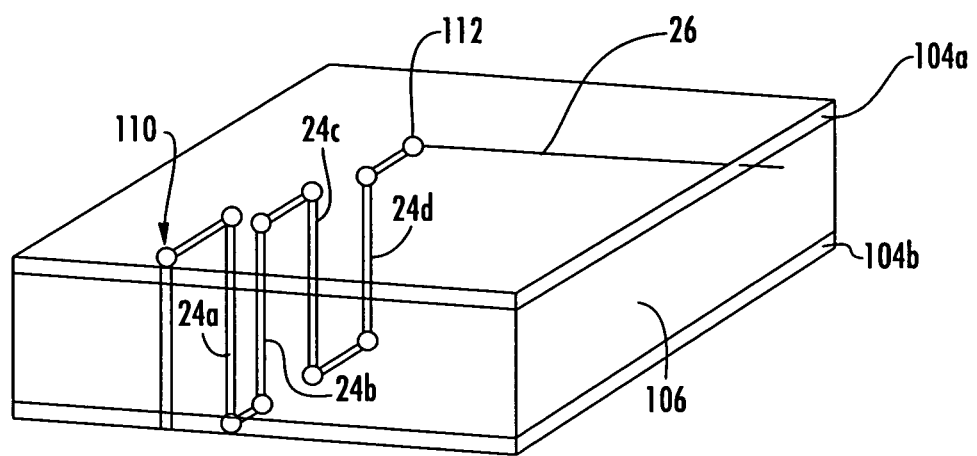
FIG. 25 is a highly schematic three-dimensional front view of an example of the dual function composite and electrical system in accordance with the subject invention.
Figure 26:
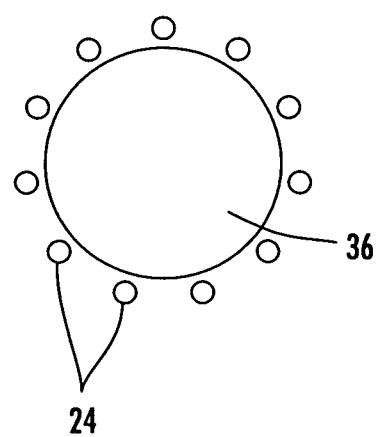
FIG. 26 is a schematic top view of conductive pins configured in one example for sidewall metallization around a cavity of a radiating element in accordance with one embodiment of the subject invention.

FIG. 24 shows one electromechanical test tile structure 100 manufactured in accordance with this invention where electrical pathways are formed between path 102 on each face plate 104a and 104b on foam core 106. In this way, as shown in FIG. 25, a wide variety of electrical interconnections could be formed to provide signal transmission between point 110 on face sheet 104a to point 112 through core 106 (e.g., a foam or air core) via transversely extending pins 24a and 24b. Conventional plated through hole technology cannot be used with most foam core composites and thus pins 24 provide a suitable replacement to provide pathways through the structure. And then, to provide electrical pathways in the planar direction of a composite structure, conductors are integrated with the fabric of at least one ply thereof, e.g., conductor 26 interwoven with the fabric of a ply of composite face sheet 104a. More than one ply may include conductive wires woven, knitted, or braided with the fabric thereof, and the internal or external plies could be chosen as desired to include pathways through the structure. Pins can be inserted through the thickness of a core, as discussed above and in U.S. Pat. No. 6,291,049 which is incorporated herein by this reference, to reinforce the structure, to prevent delamination of the individual plies with respect to each other, and to provide electrical pathways through the structure. In such an example, foam core 106, FIG. 25 could be eliminated and there would simply be a number of composite fabric plies between face plate 104a and face plate 104b. Thus, aircraft wing notational antenna subsystem referred to in FIGS. 2-24 above are but only a few examples of the wide variety of uses of the innovative technology of the subject invention. Other uses include, but are not limited to, thermal conductivity and management, where pins serve as thermal shunts to transfer heat, or pins 24 may be inserted through the thickness of the composite structure to provide sidewall metallization around the cavity of a radiating element 36, as shown in FIG. 26.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A dual function composite system comprising:
    a first electronic subsystem;
    a second electronic subsystem; and
    a composite structural support member between the first and second electronic subsystems and including:
        plies of fabric,
        resin impregnating the plies of fabric, and
        the plies of the fabric including wire signal transmission elements woven, knitted or braided with threads of the plies of fabric and running mainly in the plane of said composite member, said signal transmission elements interconnecting the first electronic subsystem with the second electronic subsystem.

2. The system of claim 1 in which the first electronic subsystem is a notional antenna subsystem integrated with an aircraft panel, the second electronic subsystem includes electronics for the notional antenna subsystem, and the composite member is a structural member supporting the aircraft panel.

3. The system of claim 2 in which the aircraft panel is a wing panel and the structural member is a wing spar.

4. The system of claim 1 including a plurality of conductive pins extending through a dielectric core from a first side of the core to a second side of the core.

5. The system of claim 4 further including a printed circuit board electrically connected to one end of the pins.

6. The system of claim 5 in which the printed circuit board is electrically connected to the signal transmission elements in the composite member.

7. The system of claim 6 in which the dielectric core is air.

8. The system of claim 7 in which the dielectric core includes a dielectric support mechanism for separating the first side of the core from the second side of the core.

9. The system of claim 8 in which the dielectric support mechanism is a dielectric honeycomb structure.

10. The system of claim 8 in which the dielectric support mechanism is a dielectric truss structure.

11. The system of claim 10 in which the truss structure includes a network of dielectric pins forming the truss structure.

12. The system of claim 6 in which the dielectric core is a low density material.

13. The system of claim 6 in which the dielectric core is foam.

14. The system of claim 6 in which the dielectric core is a polymer.

15. The system of claim 6 further including a radome layer over one side of the core.

16. The system of claim 15 in which the radome layer is made of astroquartz.

17. The system of claim 6 including a ground plane which is a composite layer including plies of conductive fibers impregnated with a resin.

18. The system of claim 17 in which the fibers are carbon.

19. The system of claim 17 in which the ground plane includes holes therethrough for the conductive pins.

20. The system of claim 19 in which the conductive pins are insulated.

21. The system of claim 19 in which the holes provide clearance between the conductive pins and the ground plane.

22. The system of claim 6 further including a structural layer between a ground plane and the printed circuit board.

23. The system of claim 22 in which the structural layer includes a foam sub-layer on a composite sub-layer.

24. The system of claim 23 in which the composite sub-layer includes fibers impregnated with a resin.

25. The system of claim 24 in which the composite sub-layer fibers are carbon.

26. The system of claim 6 in which the pins are solid and made of a metal alloy.

27. The system of claim 26 in which the metal alloy includes copper.

28. The system of claim 6 in which the pins include a composite core surrounded by metal coating.

29. The system of claim 6 in which the pins include a central conductor surrounded by a dielectric material surrounded by a coaxial shield conductor.

30. The system of claim 6 in which the pins are tubular.

31. The system of claim 6 in which the pins are configured to provide sidewall metallization around a cavity of a radiating element.

32. The system of claim 6 including radiating elements printed on the dielectric core.

33. The system of claim 32 in which the pins are inserted through holes drilled in the dielectric core.

34. The system of claim 33 in which the pins are first inserted through the holes drilled in the dielectric core and the radiating elements are then printed over the pins.

35. The system of claim 1 in which the signal transmission elements integrated with the fabric by weaving, knitting or braiding.

36. The system of claim 35 in which said wires are insulated.

37. A dual function composite system comprising:
a first electronic subsystem;
a second electronic subsystem;
the first electronics subsystem separated from a ground plane by a dielectric core and a plurality of conductive pins extending through the core each connected on one end to the first electronics subsystem and on the other end to the second electronics subsystem; and
a structural support composite member between the first and second electronic subsystems and including:
plies of fabric,
resin impregnating the plies of fabric, and
at least one ply of the fabric including wire signal transmission elements integrated with threads of the fabric and running mainly in the plane of said composite member, said signal transmission elements interconnecting the first electronic subsystem with the second electronic subsystem.

38. A dual function composite system comprising:
a notional antenna subsystem integrated with an aircraft wing panel including:
an array of radiating elements separated from a ground plane by a dielectric core and a plurality of conductive pins extending through the core each connected on one end to a radiating element, and
a printed circuit board electrically connected to the other ends of the pins;
electronics for the notional antenna subsystem; and
a wing spar between the notional antenna subsystem and the electronics therefore and including:
plies of fabric,
resin impregnating the plies of fabric, and
at least one ply of the fabric including wires integrated therewith and interconnecting the printed circuit board with the electronics.

39. A method of manufacturing a dual function composite system, the method comprising:
adding, in a composite member including multiple fabric plies impregnated with resin for structural support, said composite member extending between first and second electronic subsystems, in plies of the composite member, wire signal transmission elements woven, knitted or braided with threads of the fabric plies and running mainly in the plane of said composite member to interconnect the first electronic subsystem with the second electronic subsystem.

40. The method of claim 39 in which the first electronic subsystem is a notional antenna subsystem integrated with an aircraft panel, the second electronic subsystem includes electronics for the notional antenna subsystem, and the composite member is a structural member supporting the aircraft panel.

41. The method of claim 40 in which the aircraft panel is a wing panel and the structural member is a wing spar.

42. The method of claim 41 including a plurality of conductive pins extending through the core from a first side of the core to a second side of the core.

43. The method of claim 42 further including electrically connecting a printed circuit board to one end of the pins.

44. The method of claim 43 further including electrically connecting the printed circuit board to the signal transmission elements in the composite member.

45. The method of claim 44 in which the dielectric core is air.

46. The method of claim 45 in which the dielectric core includes a dielectric support mechanism for separating the radiating elements from the ground plane.

47. The method of claim 46 in which the dielectric support mechanism is a dielectric honeycomb structure.

48. The method of claim 46 in which the dielectric support mechanism is a dielectric truss structure.

49. The method of claim 48 in which the truss structure includes a network of dielectric pins forming the truss structure.

50. The method of claim 44 in which the dielectric core is a low density material.

51. The method of claim 44 in which the dielectric core is foam.

52. The method of claim 44 in which the dielectric core is a polymer.

53. The method of claim 44 further including adding a radome layer over the radiating elements.

54. The method of claim 53 in which the radome layer is made of astroquartz.

55. The method of claim 44 in which the ground plane is a composite layer including plies of conductive fibers impregnated with a resin.

56. The method of claim 55 in which the fibers are carbon.

57. The method of claim 44 further including adding a structural layer between the ground plane and the printed circuit board.

58. The method of claim 57 in which the structural layer includes a foam sub-layer on a composite sub-layer.

59. The method of claim 58 in which the composite sub-layer includes fibers impregnated with a resin.

60. The method of claim 59 in which the composite sub-layer fibers are carbon.

61. The method of claim 44 in which the ground plane includes holes therethrough for the conductive pins.

62. The method of claim 61 in which the holes provide clearance between the conductive pins and the ground plane.

63. The method of claim 44 in which the conductive pins are insulated.

64. The method of claim 44 in which the pins are solid and made of a metal alloy.

65. The method of claim 64 in which metal alloy includes copper.

66. The method of claim 44 in which the pins include a composite core surrounded by metal coating.

67. The method of claim 44 in which the pins include a central conductor surrounded by dielectric material surrounded by a coaxial shield conductor.

68. The method of claim 44 in which the pins are tubular.

69. The method of claim 44 in which the pins are configured to provide side wall metallization around a cavity of a radiating element.

70. The method of claim 44 further including printing the radiating elements on the dielectric core.

71. The method of claim 70 further including inserting the pins through holes drilled in the dielectric core.

72. The method of claim 71 in which the pins are first inserted through the holes drilled in the dielectric core and the radiating elements are then printed over the pins.

73. The method of claim 39 in which the signal transmission elements are integrated with the fabric by weaving, knitting or braiding.

74. The method of claim 73 in which said wires are insulated.

75. A dual function composite system comprising:
   a notional antenna subsystem integrated with an aircraft wing panel;
   an electronic subsystem including electronics for the notional antenna subsystem; and
   a structural support wing spar member between the notional antenna and the electronic subsystem, said structural member supporting the aircraft panel and including:
   plies of fabric,
   resin impregnating the plies of fabric, and
   at least one ply of the fabric including wire signal transmission elements woven, knitted or braided with threads of the fabric and running mainly in the plane of the said structural support member, said signal transmission elements interconnecting the notional antenna subsystem with the electronic subsystem.

* * * * *